(12) United States Patent
Chen et al.

(10) Patent No.: US 10,410,736 B2
(45) Date of Patent: *Sep. 10, 2019

(54) MANUFACTURER SELF-TEST FOR SOLID-STATE DRIVES

(71) Applicant: Seagate Technology LLC, Cupertino, CA (US)

(72) Inventors: Zhengang Chen, San Jose, CA (US); David Patmore, Los Altos Hills, CA (US); Yingji Ju, Shanghai (CN); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 185 days.

This patent is subject to a terminal disclaimer.

(21) Appl. No.: 15/423,692

(22) Filed: Feb. 3, 2017

(65) Prior Publication Data

US 2017/0148530 A1    May 25, 2017

Related U.S. Application Data

(63) Continuation of application No. 14/223,407, filed on Mar. 24, 2014, now Pat. No. 9,595,352.

(Continued)

(51) Int. Cl.
*G11C 29/42* (2006.01)
*G11C 29/44* (2006.01)
*G11C 29/36* (2006.01)
*H03M 13/11* (2006.01)
*H04L 1/00* (2006.01)
*G06F 11/00* (2006.01)
*G11C 7/10* (2006.01)
*G06F 3/06* (2006.01)

(Continued)

(52) U.S. Cl.
CPC .............. *G11C 29/42* (2013.01); *G11C 29/36* (2013.01); *G11C 29/44* (2013.01); *H03M 13/1108* (2013.01); *G06F 3/064* (2013.01); *G06F 11/00* (2013.01); *G11C 7/10* (2013.01); *G11C 11/5628* (2013.01); *G11C 16/00* (2013.01); *G11C 16/10* (2013.01); *G11C 29/52* (2013.01); *H04L 1/00* (2013.01)

(58) Field of Classification Search
CPC ......... G11C 29/52; G11C 16/10; G11C 29/42; G11C 11/5628; G11C 29/44; G11C 16/00; G11C 29/36; G11C 7/10; G06F 3/064; G06F 11/00; H04L 1/00
See application file for complete search history.

(56) References Cited

U.S. PATENT DOCUMENTS 5,828,579 A    10/1998  Beausang ...................... 716/102
6,370,669 B1   4/2002   Eroz et al. ..................... 714/774
(Continued)

*Primary Examiner* — April Y Blair
*Assistant Examiner* — Sazzad Hossain
(74) *Attorney, Agent, or Firm* — Setter Roche LLP; Kirk A. Cesari

(57) ABSTRACT

An apparatus includes a memory and a controller. The memory may be configured to store data. The controller may be configured to process a plurality of input/output requests to a plurality of blocks of the memory that are not marked as bad on a block list, perform a code rate test that programs the plurality of blocks of the memory at three or more code rates of an error correction code scheme, and mark any of the plurality of blocks identified as bad during the code rate test on the block list.

20 Claims, 7 Drawing Sheets

Related U.S. Application Data

(60) Provisional application No. 61/954,105, filed on Mar. 17, 2014.

(51) Int. Cl.
  *G11C 11/56* (2006.01)
  *G11C 29/52* (2006.01)
  *G11C 16/10* (2006.01)
  *G11C 16/00* (2006.01)

(56) References Cited

U.S. PATENT DOCUMENTS

| | | | |
|---|---|---|---|
| 6,640,321 B1 | 10/2003 | Huang | 714/718 |
| 7,873,885 B1 | 1/2011 | Shin et al. | 714/724 |
| 8,621,318 B1 | 12/2013 | Micheloni | 714/755 |
| 9,128,858 B1* | 9/2015 | Micheloni | G06F 11/10 |
| 9,595,352 B2* | 3/2017 | Chen | G11C 29/44 |
| 2001/0028684 A1 | 10/2001 | Chung | 375/261 |
| 2002/0156910 A1 | 10/2002 | Senda | 709/232 |
| 2003/0229843 A1 | 12/2003 | Yu et al. | 714/794 |
| 2003/0229847 A1 | 12/2003 | Kim | 715/501.1 |
| 2004/0260995 A1 | 12/2004 | Allpress | 714/755 |
| 2007/0081401 A1 | 4/2007 | Chen | 365/200 |
| 2008/0168332 A1 | 7/2008 | Palanki et al. | 714/776 |
| 2009/0019335 A1* | 1/2009 | Boyer | H03M 13/1105 714/755 |
| 2009/0132889 A1* | 5/2009 | Radke | G06F 11/1068 714/763 |
| 2010/0042774 A1 | 2/2010 | Yang et al. | 711/103 |
| 2010/0241928 A1* | 9/2010 | Kim | G06F 11/1012 714/763 |
| 2010/0325511 A1 | 12/2010 | Oh | 714/752 |
| 2011/0264980 A1 | 10/2011 | Li et al. | 714/752 |
| 2011/0302445 A1 | 12/2011 | Byom | 714/6.1 |
| 2012/0124436 A1 | 5/2012 | Okahiro | 714/726 |
| 2012/0272114 A1 | 10/2012 | Cho et al. | 714/748 |
| 2013/0021852 A1 | 1/2013 | Jeong | 365/189.05 |
| 2013/0124932 A1 | 5/2013 | Schuh et al. | 714/718 |
| 2013/0124945 A1* | 5/2013 | Hu | H03M 13/13 714/773 |
| 2013/0275691 A1 | 10/2013 | Chew | 711/154 |
| 2013/0336059 A1 | 12/2013 | Lee et al. | 365/185.09 |
| 2014/0059278 A1 | 2/2014 | Schuh et al. | 711/103 |
| 2014/0173171 A1 | 6/2014 | Chen | 711/102 |
| 2015/0026528 A1* | 1/2015 | d'Abreu | G11C 29/56012 714/718 |
| 2015/0074476 A1 | 3/2015 | Kim | 714/723 |

* cited by examiner

MANUFACTURER SELF-TEST FOR SOLID-STATE DRIVES

This application relates to U.S. Ser. No. 14/223,407, filed Mar. 24, 2014, which relates to U.S. Provisional Application No. 61/954,105, filed Mar. 17, 2014, each of which are hereby incorporated by reference in their entirety.

FIELD OF THE INVENTION

The invention relates to storage generally and, more particularly, to a method and/or apparatus for implementing a manufacturer self-test for solid-state drives.

BACKGROUND

A solid-state drive (SSD) is composed of the storage media, the controller and other peripheral components. The storage media used in SSDs is NAND flash memory. During the manufacturing of SSDs, a self-testing procedure for testing the drive is performed before shipping. The purpose of a manufacturer self-test (MST) includes, but is not limited to, (1) testing whether the drive meets product requirements (if the drive does not meet certain criteria, it is not qualified or shipped), (2) pre-conditioning the flash memory media, and (3) initializing parameters that are needed for the SSD to be able to start normal operations when it arrives at the customer without additional efforts. An MST should also consider practical factors such as test time. Faster testing of a drive is normally considered better than slower testing. A MST is often run automatically on a large number of drives during mass production. Therefore, the test time among different drives should be reasonably consistent.

SUMMARY

The invention concerns an apparatus including a memory and a controller. The memory may be configured to store data. The controller may be configured to process a plurality of input/output requests to a plurality of blocks of the memory that are not marked as bad on a block list, perform a code rate test that programs the plurality of blocks of the memory at three or more code rates of an error correction code scheme, and mark any of the plurality of blocks identified as bad during the code rate test on the block list.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a manufacturer self-test for solid-state drives that may (i) implement a multi-plane scan and still be capable of detecting bad blocks in a single-plane configuration, (ii) embed a thorough code rate test in the MST scan, (iii) perform a thorough code rate test on every block rather than predicting code rates, (iv) minimize the manufacturer self-test time, (v) perform consistently across a plurality of solid-state drives, (vi) be easy to implement, and/or (vii) be implemented as one or more integrated circuits.

Embodiments of the invention include a method for initializing a bad block list and/or a code rate table during a manufacturer self-test (MST). The method may handle both multi-plane and single-plane blocks. The code rate test may be embedded in the pre-conditioning scans of MST. Embedding the code rate test in the pre-conditioning scans of the MST may add a minimal amount of extra time to the MST.

Some flash memory exhibits infant mortality (e.g., a block or even larger granularity may fail after a very low number of program/erase cycles (PEC)). Infant mortality in flash memory may be caused by manufacturing defects. It is better to discover memory that will fail quickly as soon as possible, such as during the manufacturer self-test (MST) time. Memory that has failed may be considered a bad block.

The MST may list bad blocks. Generally, flash memory vendors mark bad blocks. However, it is necessary for the SSD controller to discover the marked bad blocks, track the bad blocks, and avoid using them to read and write data from the beginning. Also, there may be additional bad blocks that have "grown" from the time the flash vendor marked the initial bad blocks. The additional bad blocks may be discovered during the MST pre-conditioning scans.

The MST may be configured to perform initial error correction code (ECC) rates for each code rate granularity. Generally, an SSD controller adopts an adaptive code rate policy to improve the life of the drive. For example, if a block is used as the ECC code rate granularity, a code rate for each block in the SSD may need to be initialized.

Embodiments of the invention address the problem of initializing the two parameters in a MST, the grown bad block list and the initial code rate table. Embodiments of the invention may be applicable to SSD controllers that adjust code rates throughout the life of the drive and/or among different physical locations of flash media. In one example, an adaptive code rate policy may be proposed for low-density parity-check (LDPC) codes applied in an SSD controller. However, embodiments of the invention may be varied to meet the design criteria of a particular implementation. For example, embodiments of the invention may be applied to various ECC schemes.

Figure 1:
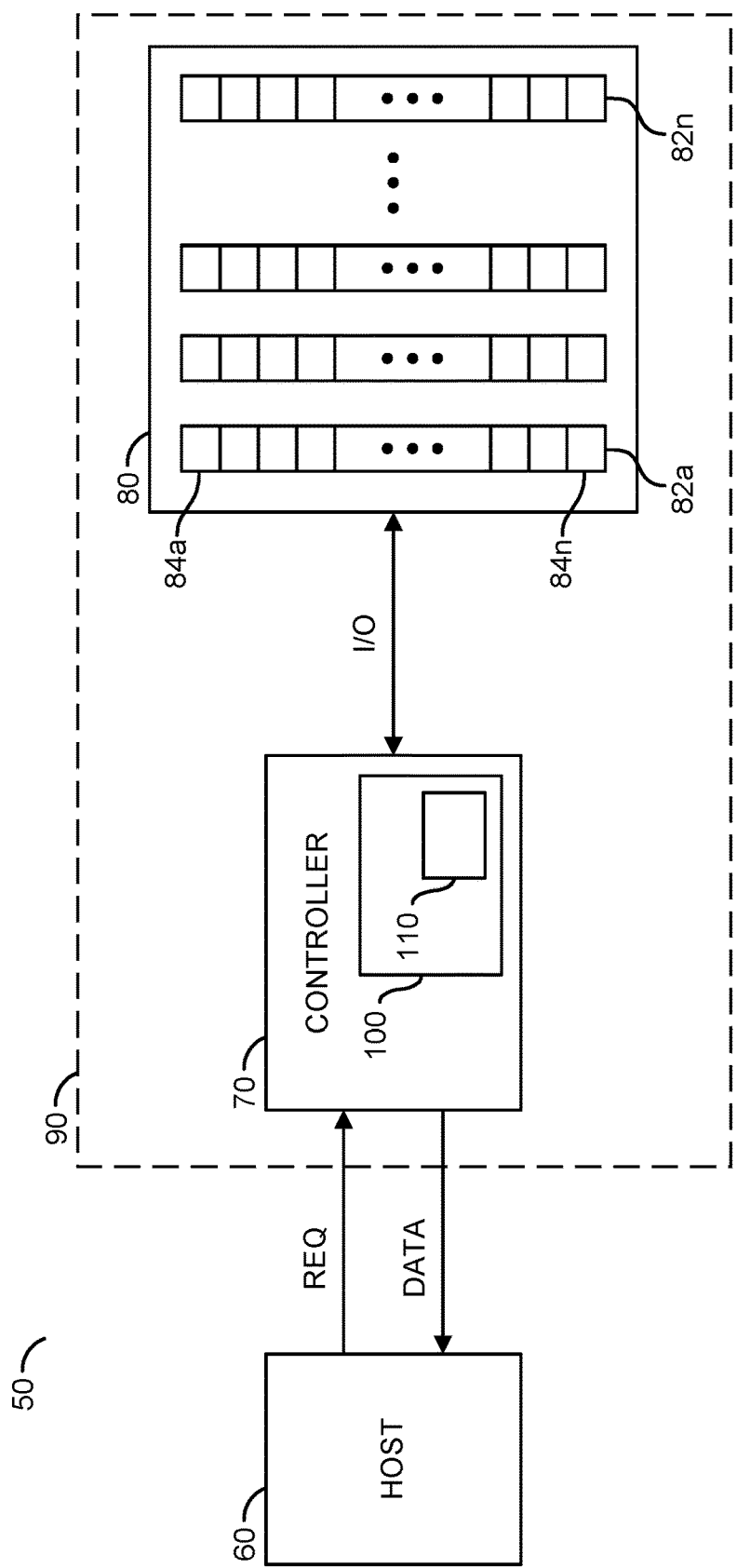
FIG. 1 is a diagram illustrating an example embodiment.

Referring to FIG. 1, a block diagram of an example apparatus 50 is shown. The apparatus 50 generally comprises a block (or circuit) 60, a block (or circuit) 70 and a block (or circuit) 80. The circuit 70 may include a circuit 100. The circuit 100 may be a memory/processor configured to store computer instructions (or firmware) or may be logic. The instructions, when executed, may perform a number of steps. The firmware 100 may include a redundancy control module 110. The redundancy control module 110 may be implemented as part of the firmware 100 or as a separate module. While an example of redundancy implemented in the firmware 100 is shown, the redundancy may be implemented, in another example, in hardware (e.g., logic such as a state machine).

A signal (e.g., REQ) may be generated by the circuit 60. The signal REQ may be received by the circuit 70. The signal REQ may be a request signal that may be used to access data from the circuit 80. A signal (e.g., I/O) may be generated by the circuit 70 to be presented to/from the circuit 80. The signal REQ may include one or more address bits. A signal (e.g., DATA) may be one or more data portions received by the circuit 60.

The circuit 60 is shown implemented as a host circuit. The circuit 70 reads and writes data to and from the circuit 80. The circuit 80 is generally implemented as a nonvolatile memory circuit. The circuit 80 may include a number of modules 82a-82n. The modules 82a-82n may be implemented as NAND flash chips. In some embodiments, the circuit 80 may be a NAND flash device. In other embodiments, the circuit 70 and/or the circuit 80 may be implemented as all or a portion of a solid state drive 90 having one or more nonvolatile devices. The circuit 80 is generally operational to store data in a nonvolatile condition. When data is read from the circuit 80, the circuit 70 may access a set of data (e.g., multiple bits) identified in the signal REQ. The signal REQ may request data from the drive 90 or from one of a number of additional storage devices.

Data within the circuit 80 is generally organized in a hierarchy of units, such as die, plane, block, and/or page units. The circuit 80 may contain multiple dies (e.g., in a single package or multiple packages). Generally, for enterprise applications the circuit 80 may be comprised of hundreds of flash memory dies. Flash memory may have multiple planes in the same die. The planes may be accessed in parallel to improve performance.

A first type of redundancy may be implemented as a redundancy block. A redundancy block is a combination of blocks (e.g., a block from each nonvolatile memory die in the circuit 80) that can be combined to form a redundant array of silicon independent elements, similar to a redundant array of independent disks for magnetic media. The nonvolatile memory locations within the blocks may be written in a striped fashion. In some embodiments, organizing a plurality of blocks in redundancy blocks reduces an overhead of block management. A block is generally considered a smallest quantum of erasing. A page is generally considered a smallest quantum of writing. A read unit (or codeword or Epage or ECC-page) is a smallest correctable quantum of reading and/or error correction. Each block includes an integer number of pages. Each page includes an integer number of read units.

In some embodiments, the circuit 80 may be implemented as a single-level cell (e.g., SLC) type circuit. An SLC type circuit generally stores a single bit per memory cell (e.g., a logical 0 or 1). In other embodiments, the circuit 80 may be implemented as a multi-level cell (e.g., MLC) type circuit. An MLC type circuit is generally capable of storing multiple (e.g., two) bits per memory cell (e.g., logical 00, 01, 10 or 11). In still other embodiments, the circuit 80 may implement a triple-level cell (e.g., TLC) type circuit. A TLC circuit may be able to store multiple (e.g., three) bits per memory cell (e.g., a logical 000, 001, 010, 011, 100, 101, 110 or 111).

In general, the controller 70 may include an erase/program unit that may implement redundancy across the modules 82a-82n. For example, multiple blocks may be read from multiple dies 82a-82n. The erase/program unit may be implemented as part of the firmware (or logic) 100.

The drive 90 may contain, in one example, multiple NAND Flash or memory modules 82a-82n. Each of the memory modules may be fabricated as one or more dies (e.g., 1, 2, 4, 8, etc.). The dies (or modules) 82a-82n may operate to read or to write concurrently. The read and write bandwidth depends on how many of the dies 82a-82n are implemented, as well as the bandwidth of each of the dies 82a-82n. Each of the dies 82a-82n may contain a plurality of planes. Each of the planes of the dies 82a-82n may contain a plurality of blocks 84a-84n. The blocks 84a-84n of the planes of one of the dies 82a-82n may be accessed in parallel. If the SSD drive 90 receives the host command REQ, in order to achieve the best performance, and/or to address wear leveling issues, the drive 90 will walk through all of the dies 82a-82n (e.g., a first page of DIE0, DIE1 . . . DIEn, then a next page of DIE0).

Figure 2:
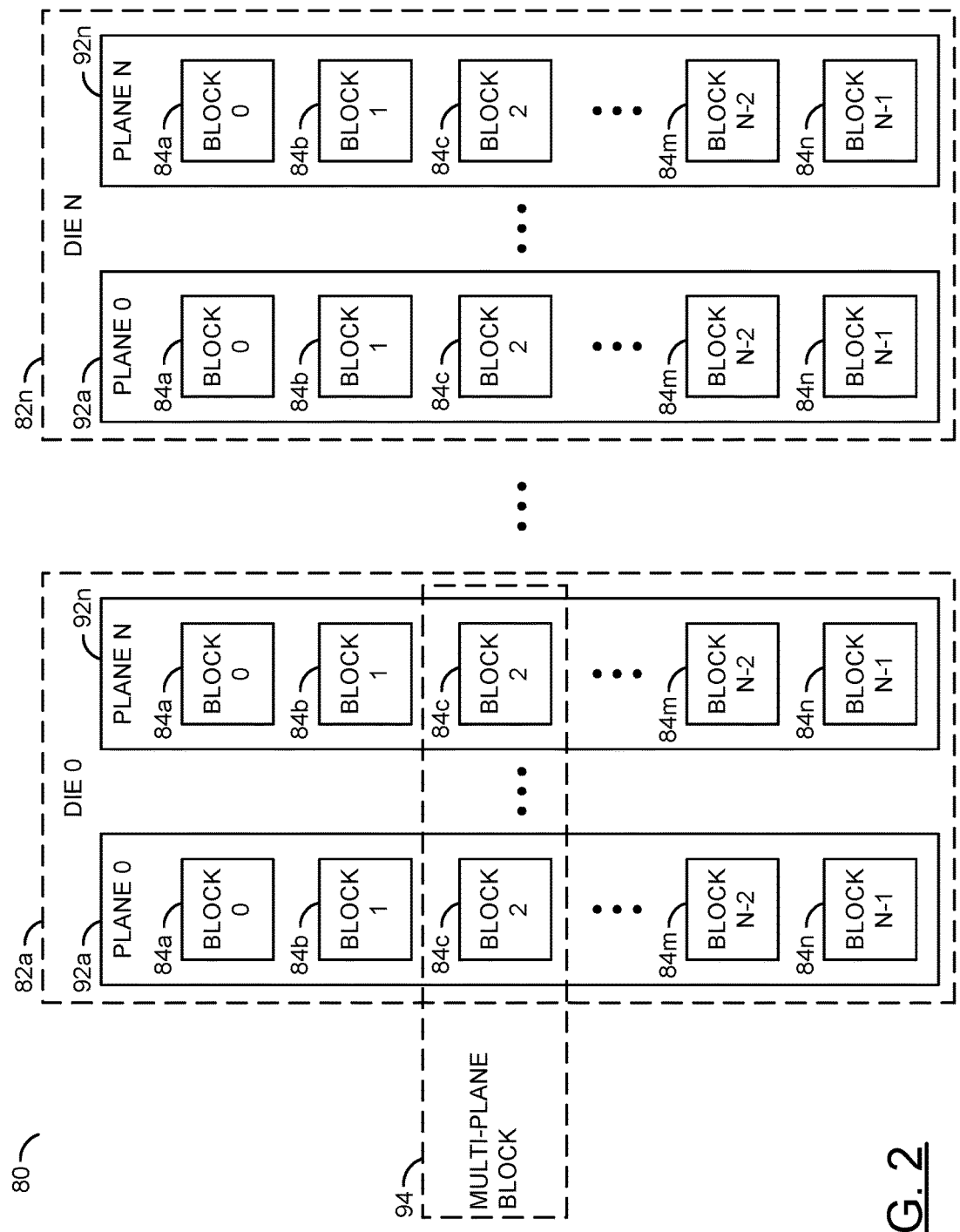
FIG. 2 is a diagram illustrating an example of a multi-plane memory block.

Referring to FIG. 2, a block diagram illustrating the memory circuit 80 with an example embodiment of a multi-plane memory block is shown. The memory circuit 80 generally comprises the die modules 82a-82n, the memory blocks 84a-84n, the blocks (or circuits) 92a-92n, and the block (or circuit) 94. Each of the die modules 82a-82n generally comprise the circuits 92a-92n. The circuits 92a-92n may be memory planes of the die modules 82a-82n. Each of the memory planes 92a-92n generally comprise the memory blocks 84a-84n. The circuit 94 may be a multi-plane block. The multi-plane block 94 is shown having access to the memory blocks 84c of the memory planes 92a-92n of the die module 82a. However, the die modules 82a-82n may have multiple multi-plane blocks (e.g., one multi-plane block for each of the memory blocks 84a-84n) to access the memory blocks 84a-84n of the memory planes 92a-92n in parallel.

A die module (e.g., one of the die modules 82a-82n) may be divided into the multiple memory planes 92a-92n. The number of memory planes 92a-92n may be varied to meet the design criteria of a particular implementation. Generally, there may be 2-4 memory planes in each of the die modules 82a-82n. Each of the memory planes 92a-92n may contain the memory blocks 84a-84n.

The flash memory 80 may be configured to allow multi-plane operation. For example, operations may include erase, program, and/or read. In multi-plane operation a multi-plane block (e.g., the multi-plane block 94) may be treated as an operation unit. Each multi-plane block 94 may contain a number of pages that may be configured as multi-plane pages.

Multi-plane operations may allow multiple blocks in a multi-plane block to be erased/programmed/read in parallel. For example, the multi-plane block 94 of the die module 82a is shown comprising the memory blocks 84c of each of the memory planes 92a-92n. Multi-plane operation allows for operations to be performed in parallel on each of the memory blocks 84c of the memory planes 92a-92n.

Generally, it is beneficial to the performance of the SSD drive 90 to assign the same code rate to all the memory blocks in a multi-plane block. Assigning the same code rate to all the memory blocks in the multi-plane block 94 is beneficial because all the blocks in the multi-plane block 94 will have the same PEC time and/or retention time. However, the blocks in the multi-plane block 94 belong to different physical planes. There may be bad blocks among the various blocks in the multi-plane block 94. If one block (e.g., one of the memory blocks 84c) in a multi-plane block (e.g., the multi-plane block 94) is a bad block, it is not generally considered capacity efficient to discard all the memory blocks in the multi-plane block. Some of the memory blocks in the multi-plane block 94 may be usable. The SSD controller 70 may be able to utilize multi-plane blocks as well as single-plane blocks. The MST of the controller 70 may initialize bad block lists on a block level granularity. The code rate assignment may apply to both single-plane blocks and/or multi-plane blocks.

Figure 3:
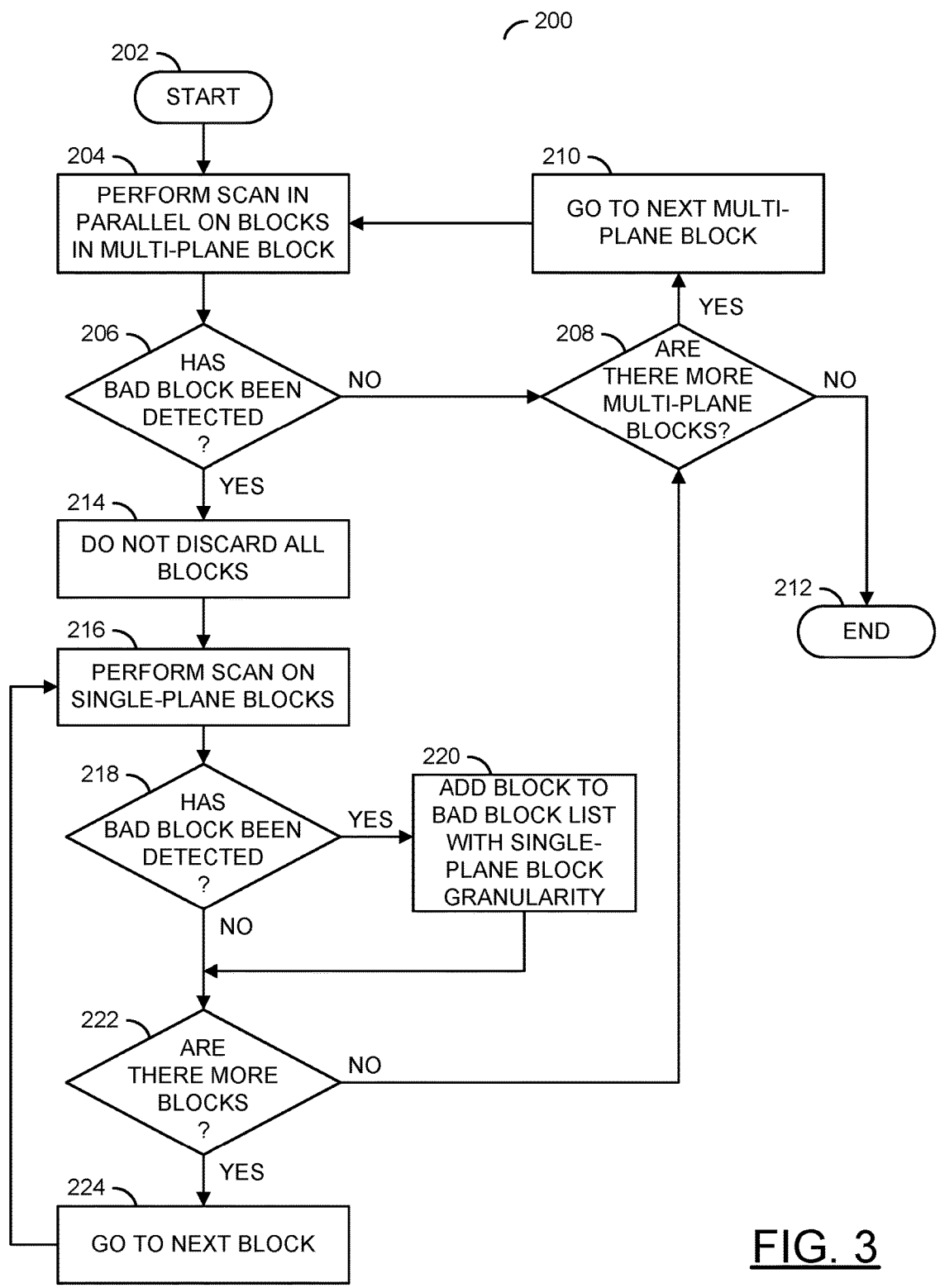
FIG. 3 is a flow diagram illustrating a method for scanning for bad blocks.

Referring to FIG. 3, a flow diagram of a method (or process) 200 is shown. The method 200 may implement scanning for bad blocks. The method 200 generally comprises a step (or state) 202, a step (or state) 204, a decision step (or state) 206, a decision step (or state) 208, a step (or state) 210, a step (or state) 212, a step (or state) 214, a step (or state) 216, a decision step (or state) 218, a step (or state) 220, a decision step (or state) 222, and a step (or state) 224. The state 202 may start the method 200. The state 204 may perform a scan in parallel on blocks in a multi-plane block (e.g., all the memory blocks 84c in the multi-plane block 94). Next, in the decision state 206 the method 200 may determine whether a bad block has been detected. If not, the method 200 may move to the decision state 208. In the decision state 208, the method 200 may determine if there are more multi-plane blocks. If not, the method 200 moves to the state 212, which ends the method 200. If so, the method 200 moves to the state 210. The state 210 may go to the next multi-plane block. Next, the method 200 returns to the state 204.

In the decision state 206, if the method 200 determines a bad block has been detected the method 200 moves to the state 214. The state 214 does not discard all blocks in the multi-plane block. Next, the state 216 performs a scan on a single-plane block. Next, the method 200 moves to the decision state 218. In the decision state 218, the method 200 may determine if a bad block has been detected. If not, the method 200 moves to the decision state 222. If so, the method 200 moves to the state 220. The state 220 adds the memory block to the bad block list with single-plane block granularity. Next, the method 200 moves to the decision state 222. In the decision state 222, the method 200 determines if there are more blocks. If not, the method 200 moves to the decision state 208. If so, the method 200 moves to the state 224. The state 224 goes to the next block. Next, the method 200 returns to the state 216. The sequence of the steps shown is an example. Other step orders may be implemented to meet the design criteria of a particular implementation.

Generally, a memory block is declared bad when an erase failure is encountered in the block, a program failure is encountered in the block, or some read and/or ECC error or condition is encountered in the block. The ECC error or condition may vary depending on which ECC scheme is used and/or whether adaptive code rate management is incorporated in the SSD controller 70. For example, with conventional BCH based ECC, the ECC or condition is generally based on an error count threshold per page or per code word, and/or uncorrectable ECC errors. In another example, iterative decodable codes such LDPC may be based on hard-decision LDPC (HLDPC) decoding failures and/or average number of iterations in the memory blocks 84a-84n.

The SSD controller 70 may implement adaptive code rate management. When a memory block fails for a reason other than a program/erase failure, adaptive code rate management attempts stronger (e.g., lower) code rates before retiring a memory block. For example, if the SSD controller 70 implements adaptive code rate management, then the read and/or ECC error condition for determining a memory block to retire is generally based on the strongest ECC code rate. In one example embodiment, LDPC may be implemented and HLDPC may be the failure criterion. The read and/or ECC error or condition may be when an HLDPC failure with the strongest code rate is encountered in the block.

Figure 4:
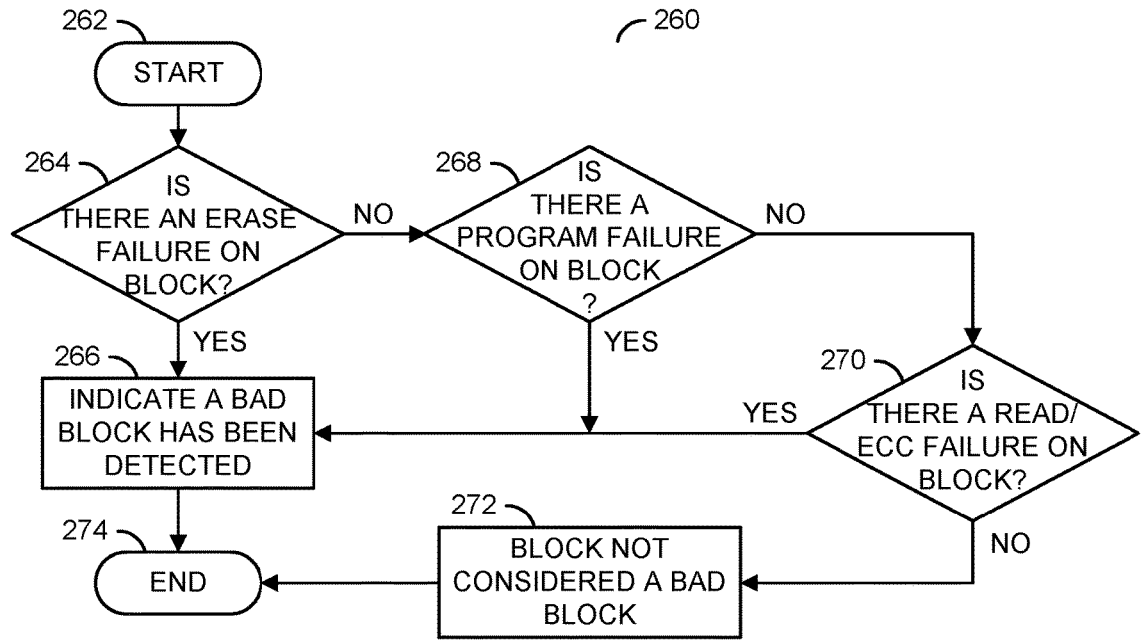
FIG. 4 is a flow diagram illustrating bad block detection criteria.

Referring to FIG. 4, a flow diagram of a method (or process) 260 is shown. The method 260 may implement a bad block detection criteria. The method 260 generally comprises a step (or state) 262, a decision step (or state) 264, a step (or state) 266, a decision step (or state) 268, a decision step (or state) 270, a step (or state) 272, and a step (or state) 274. The state 262 may start the method 260. Next, the method 260 may move to the decision state 264. In the decision state 264, if the method 260 determines there is an erase failure on the block (e.g., on one of the blocks 84a-84n) the method 260 may move to the state 266. The state 266 may indicate a bad block has been detected. Next, the method 260 moves to the state 274, which ends the method 260. In the decision state 264, if the method 260 determines there is not an erase failure on the block the method 260 moves to the decision state 268. In the decision state 268, if the method 260 determines there is a program failure on the block the method 260 moves to the state 266. If not, the method 260 moves to the decision state 270. Generally, without adaptive code rate management the ECC scheme may be fixed. In the decision state 270, the method 260 determines if there is a read and/or ECC failure on the block. If so, the method 260 moves to the state 266. If not, the method 260 moves to the state 272. The state 272 considers the block not a bad block. Next, the method 260 moves to the state 274, which ends the method 260. The sequence of the steps shown is an example. Other step orders may be implemented to meet the design criteria of a particular implementation.

Figure 5:
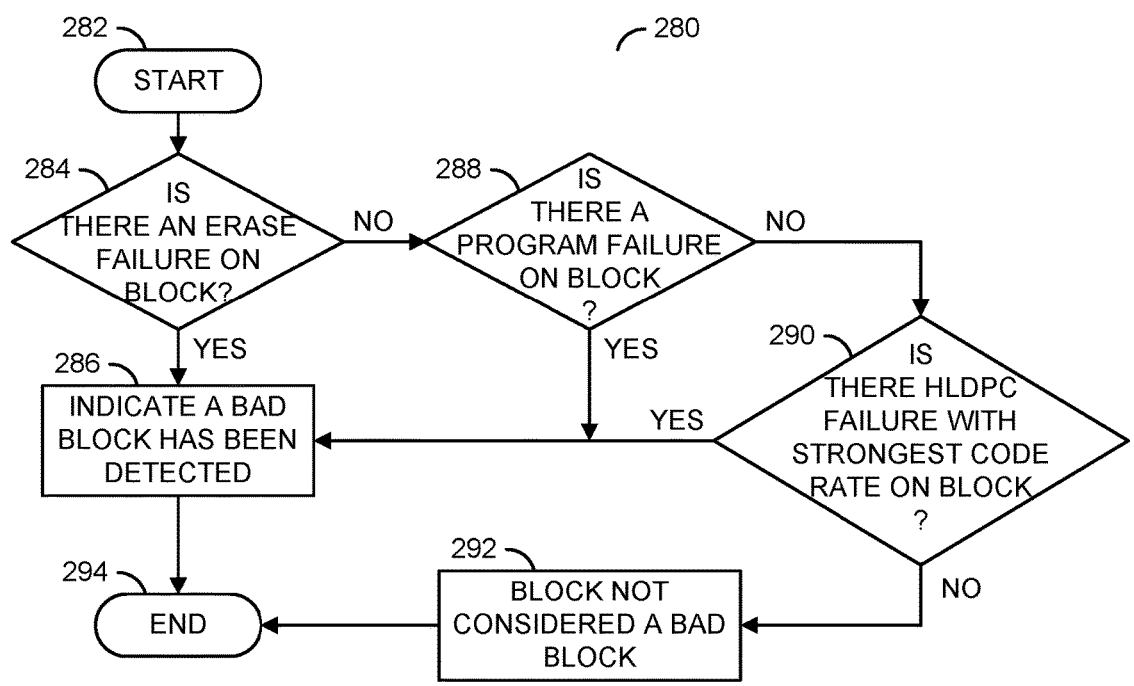
FIG. 5 is a flow diagram illustrating an example of bad block detection criteria with HLDPC.

Referring to FIG. 5, a flow diagram of a method (or process) 280 is shown. The method 280 may implement an example of bad block detection criteria with hard-decision low-density parity check (HLDPC). The method 280 generally comprises a step (or state) 282, a decision step (or state) 284, a step (or state) 286, a decision step (or state) 288, a step decision (or state) 290, a step (or state) 292, and a step (or state) 294. The state 282 may start the method 280. Next, the method 280 may move to the decision state 284. In the decision state 284, if the method 280 determines there is an erase failure on the block (e.g., on one of the blocks 84a-84n) the method 280 may move to the state 286. The state 286 may indicate a bad block has been detected. Next, the method 280 moves to the state 294, which ends the method 280. In the decision state 284, if the method 280 determines there is not an erase failure on the block the method 280 moves to the decision state 288. In the decision state 288, if the method 280 determines there is a program failure on the block the method 280 moves to the state 286. If not, the method 280 moves to the decision state 290. In the decision state 290, if the method 280 determines there is an HLDPC failure with the strongest code rate on the block the method 280 moves to the state 286. In not, the method 280 moves to the state 292. The state 292 considers the block not a bad block. Next, the method 280 moves to the state 294, which ends the method 280. The sequence of the steps shown is an example. Other step orders may be implemented to meet the design criteria of a particular implementation.

To pre-condition the SSD drive 90 with a MST, a number of scans are performed. During a scan all the memory blocks 84a-84n in the SSD drive 90 are erased and fully programmed. After the erase/program, every page (or multi-plane page) in all the memory blocks (or multi-plane memory blocks such as the multi-plane block 94) are read. Depending on characteristics of the flash memory and/or application requirements, the number of scans in a MST may vary. The number of scans may be represented by K. Generally, K>=2.

Generally, to detect bad memory blocks, scans may be performed with the strongest code rate (e.g., program and read with the strongest code rate). The code rate test may be "embedded" in the MST scans, rather than having a separate code rate test. Embedding the code rate test in the MST scan may minimize time overhead for initializing the code rate tables.

The scan is performed on the multi-plane block unit, unless any block in the multi-plane block is already a bad block. Performing the scan on a multi-plane block may improve the time needed to perform the MST. If a bad multi-plane block is detected, the multi-plane block is erased and re-programmed with single-plane configuration with the strongest code rate. Each memory block in the single-plane is read to identify the bad memory block.

Figure 6:
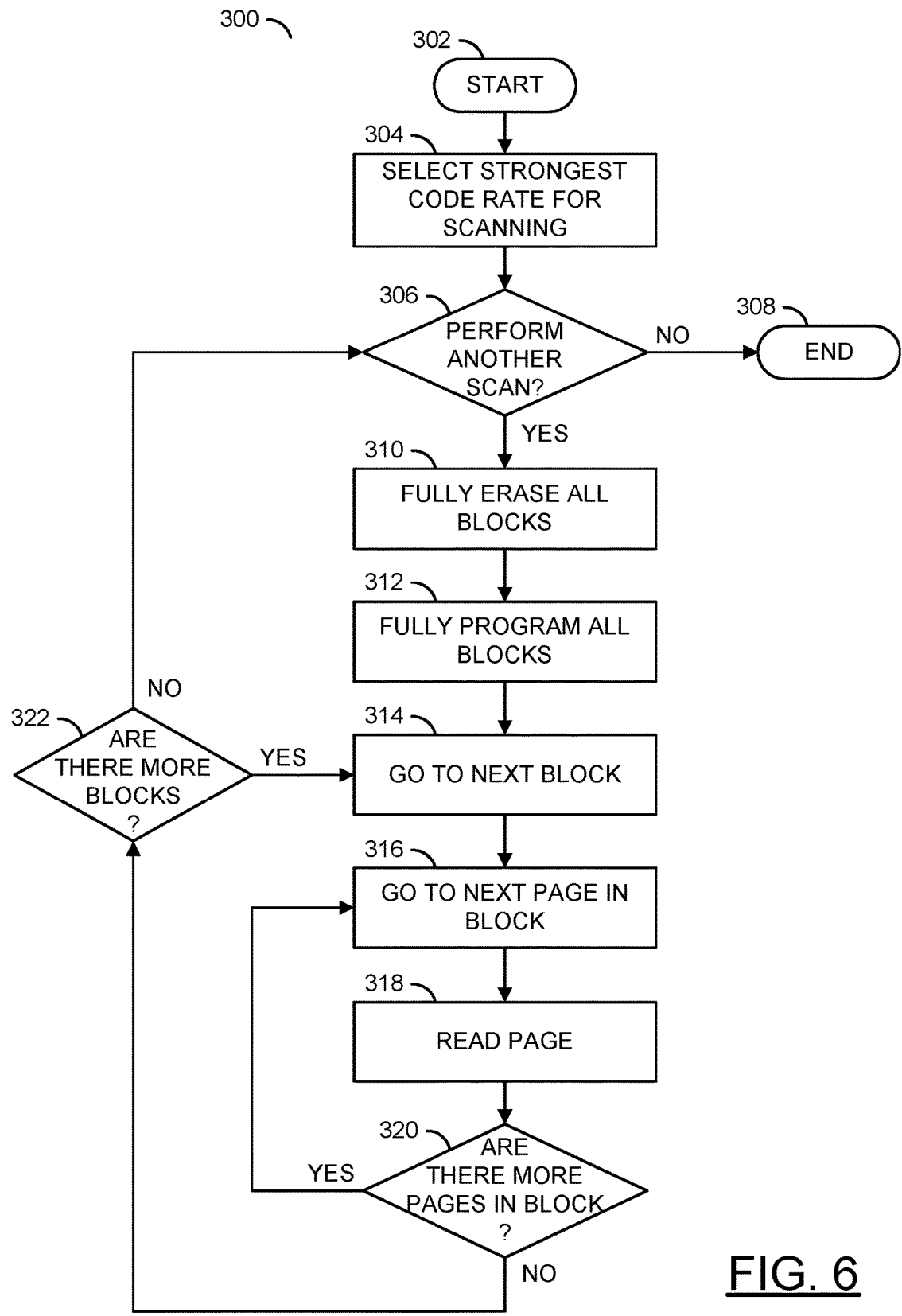
FIG. 6 is a flow diagram illustrating an example of a manufacturer self-test scan.

Referring to FIG. 6, a flow diagram of a method (or process) 300 is shown. The method 300 may implement an example of a manufacturer self-test scan. The method 300 generally comprises a step (or state) 302, a step (or state) 304, a decision step (or state) 306, a step (or state) 308, a step (or state) 310, a step (or state) 312, a step (or state) 314, a step (or state) 316, a step (or state) 318, a decision step (or state) 320, and a decision step (or state) 322. The state 302 may start the method 300. The state 304 may select the strongest code rate for the scanning. Next, the method 300 may move to the decision state 306. In the decision state 306 the method 300 may determine whether to perform another scan. If not, the method 300 may move to the state 308, which may end the method 300. If so, the method 300 may move to the state 310. The state 310 may fully erase all blocks. Next, the state 312 may fully program all blocks. The state 314 may go to the next block.

Next, the state 316 may go to the next page in the block. The state 318 may read the page. Next, the method 300 may move to the decision state 320. In the decision state 320, if the method 300 determines there are more pages in the block the method 300 returns to the state 316. If not, the method 300 moves to the decision state 322. In the decision state 322, if the method 300 determines there are more blocks the method 300 returns to the state 314. In not, the method 300 returns to the decision state 306. Generally, the method 300 may check for bad block detection criteria at various states (e.g., the bad block detection criteria described in FIGS. 4-5). For example, the bad block detection criteria may be checked after the state 310, 312, and/or 318. The method 300 may also embed a code rate test in the scan (as described in greater detail in FIGS. 7-8). The sequence of the steps shown is an example. Other step orders may be implemented to meet the design criteria of a particular implementation.

Depending on which ECC scheme is implemented by the SSD controller 70, there may be different criteria for code rate adjustment. In one example embodiment LDPC codes may be implemented. In an example embodiment with LDPC codes the criteria for code rate adjustment may be based on an average number of iterations and/or HLDPC failures. In one example, a 2-tier code rate adaptation algorithm may be implemented. In another example, raw error counts in a memory block may be used as the code rate adjustment criteria in MST. The code rate adjustment criteria may include average error count per page or per code word (e.g., in the memory block or multi-plane block), maximum error count per page or per code word (e.g., in the memory block or multi-plane block), and/or a combination of the two. The proposed MST flow may still apply to the various code rate adjustment criteria.

Figure 7:
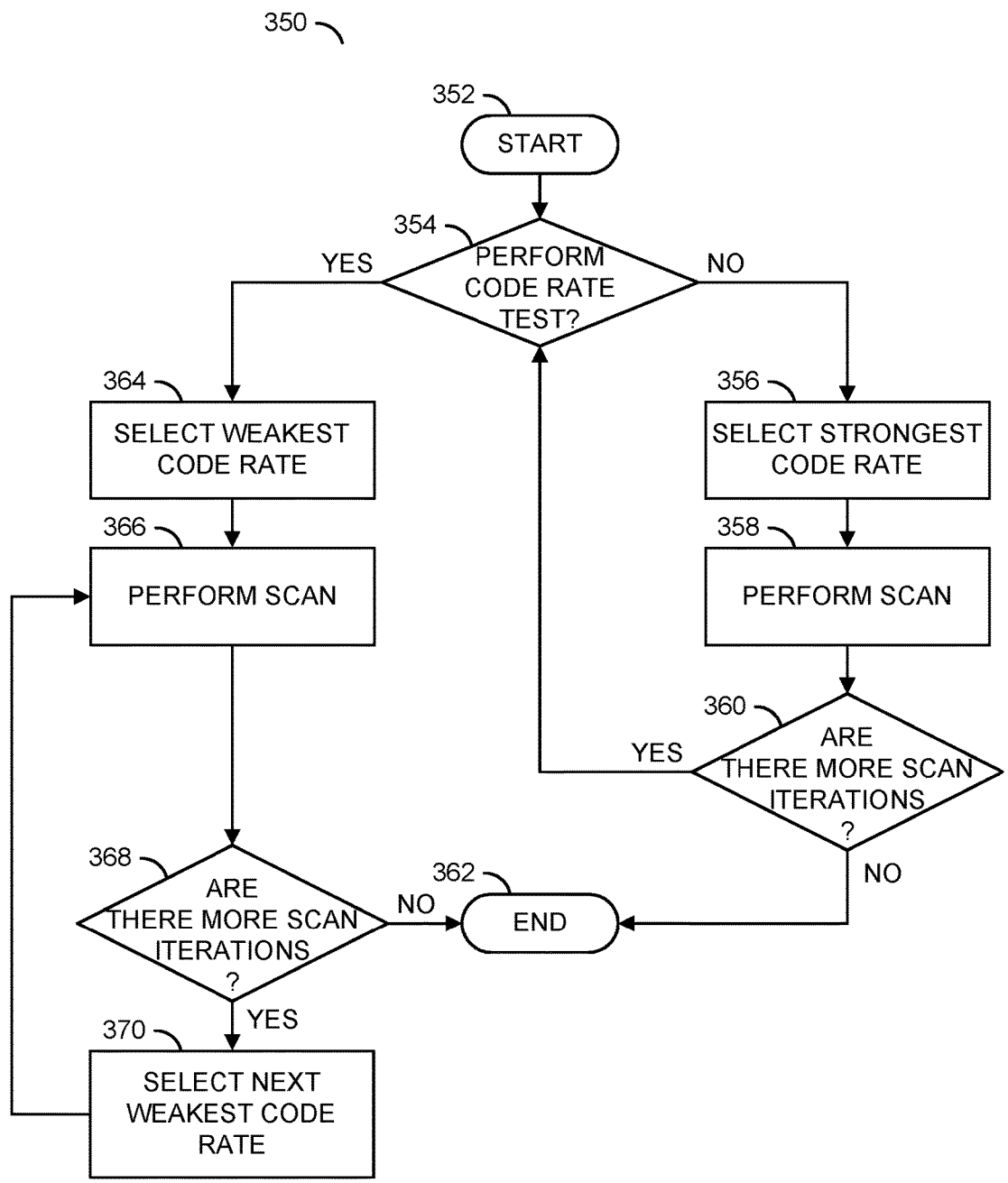
FIG. 7 is a flow diagram illustrating a code rate test embedded in the MST scan.

Referring to FIG. 7, a flow diagram illustrating a method (or process) 350 is shown. The method 350 may implement a code rate test embedded in the MST scan. The method 350 generally comprises a step (or state) 352, a decision step (or state) 354, a step (or state) 356, a step (or state) 358, a decision step (or state) 360, a step (or state) 362, a step (or state) 364, a step (or state) 366, a decision step (or state) 368, and a step (or state) 370. The state 352 may start the method 350. Next, the method 350 may move to the decision state 354. In the decision state 354, the method 350 may determine whether to perform a code rate test. The determination may be based on the number of scan iterations remaining. In the decision state 354, if the method 350 determines not to perform a code rate test the method 350 moves to the state 356. The state 356 may select the strongest code rate. The state 358 may perform a scan (e.g., the scan described in FIG. 6).

Next, the method 350 moves to the decision state 360. In the decision state 360, if the method 350 determines there are more scan iterations the method 350 may return to the decision state 354. If not, the method 350 moves to the state 362, which ends the method 350. In the decision state 354, if the method 350 decides to perform the code rate test the method 350 moves to the state 364. The state 364 may select a weakest code rate. The state 366 may perform a scan (e.g., the scan described in FIG. 6). Next, the method 350 moves to the decision state 368. In the decision state 368, if the method 350 determines there are not more scan iterations the method 350 moves to the state 362. The state 362 may end the method 350. In the decision state 368 if the method 350 determines there are more scan iterations the method 350 moves to the state 370. The state 370 may select the next weakest code rate. Next, the method 350 returns to the state 366. The sequence of the steps shown is an example. Other step orders may be implemented to meet the design criteria of a particular implementation.

The MST scan may initialize the bad block list and code rate tables. The SSD controller 70 may support a plurality of code rates. For example, the SSD controller 70 may support 5 code indices (e.g., [X0, X1, Y0, Y1, Y2]). The code rate of the code indices may satisfy CR(X0)>CR(X1)>CR(Y0) >CR(Y1)>CR(Y2) (e.g., Y2 is the strongest code rate and X0 is the weakest code rate). X and Y may denote 2 tiers of the code rate management. All of the memory blocks, except the blocks reserved for root system data and/or initial bad blocks marked by the flash vendor, may be assigned an initial code index X0. During each scan iteration, the memory blocks may be programmed with the strongest code rate (e.g., Y2). Other code rates may be used to program the memory blocks when the code rate test is needed. The code rate test is embedded in the last few rounds of scanning in the MST. If the code rate test is not embedded in the last few rounds of scanning in the MST, the code rate may need to be adjusted again during later scans in MST. If the number of iterations performed is very small, the code rate test may stop at an intermediate code rate rather than going through the full code rate test. Stopping at an intermediate code rate is acceptable because of the adaptive code rate management policy in the SSD controller 70.

Figure 8:
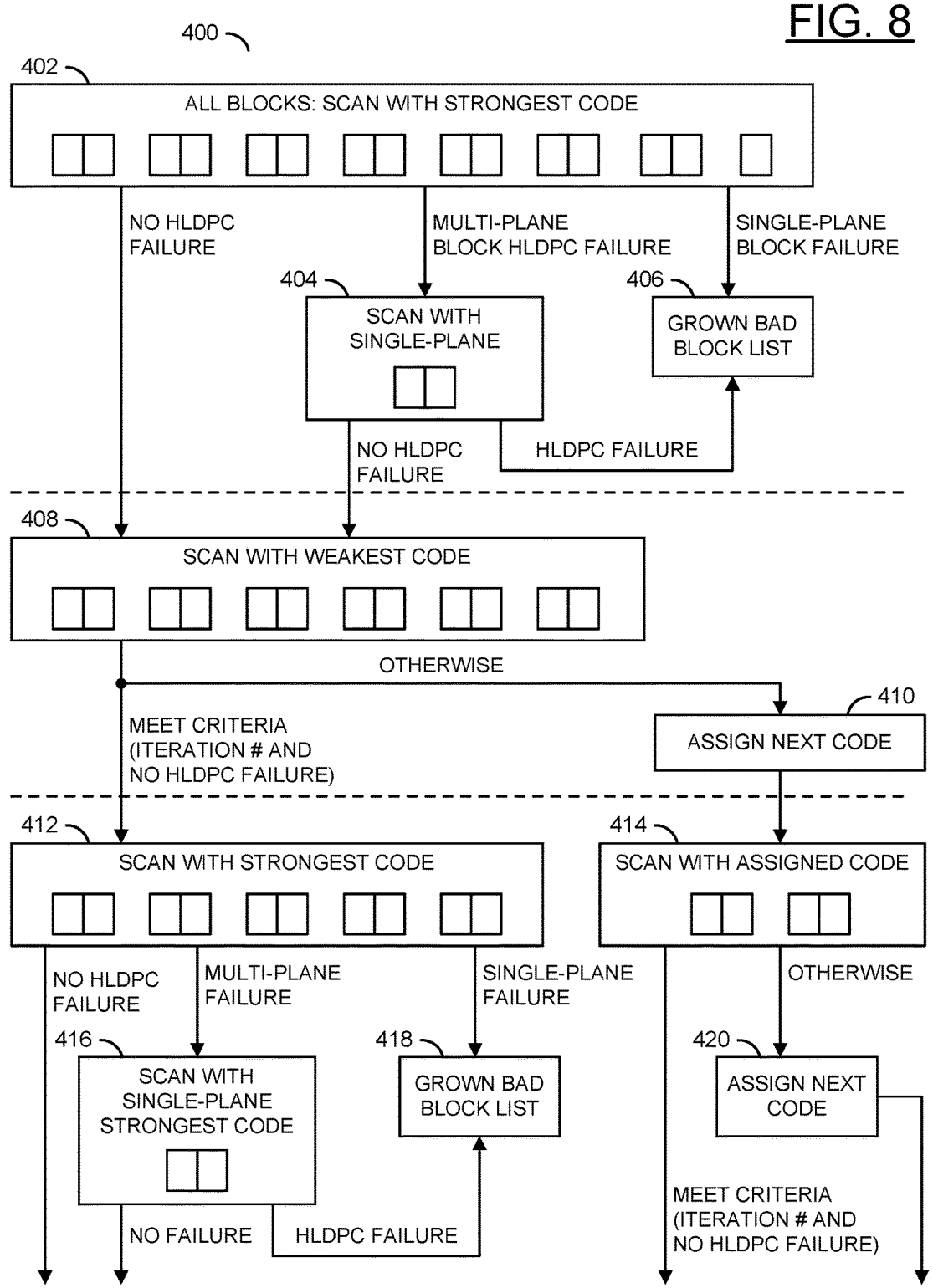
FIG. 8 is a diagram illustrating example iterations of the MST scan.

Referring to FIG. 8, example scan iterations of the MST 400 are shown. The example shown describes three iterations, however the number of iterations performed may be varied to meet the design criteria of a particular implementation. A plurality of iterations may be performed before and/or after the iterations shown. The scan iterations of the MST 400 generally comprise a step (or state) 402, a step (or state) 404, a step (or state) 406, a step (or state) 408, a step (or state) 410, a step (or state) 412, a step (or state) 414, a step (or state) 416, a step (or state) 418, and a step (or state) 420. A first scan iteration of the MST 400 may be comprised of the states 402, 404, and 406. A second scan iteration of the MST 400 may be comprised of the states 408, and 410. A third scan iteration of the MST 400 may be comprised of the states 412, 414, 416, 418, and 420.

In the first scan iteration, the state 402 may scan all memory blocks with the strongest code (e.g., Y2). The scan may be performed on multi-plane blocks and/or single-plane blocks if a bad block has been identified in the multi-plane block. If there is no HLDPC failure, the MST 400 may move to the state 408 in the second scan iteration. If there is a single-plane block failure the MST 400 may move to the state 406, which adds the bad block to the bad block list. If there is a multi-plane block HLDPC failure, the MST 400 may move to the state 404. The state 404 may perform a scan with a single-plane configuration. If there is a HLDPC failure in the single-plane configuration the MST 400 may move to the state 406, which adds the bad block to the bad block list. If there is no HLDPC failure the MST 400 may move to the state 408 in the second scan iteration. Generally, a minimum of two scan iterations are needed (e.g., K>=2).

In the second scan iteration, the state 408 may scan all the memory blocks with the weakest code (e.g., X0). The scan may be performed on multi-plane blocks and/or single-plane blocks if a bad block has been identified in the multi-plane block. If the scan meets the criteria for the weakest code (e.g., no HLDPC failure and the number of iterations to perform is less than a pre-determined threshold) the MST 400 moves to the state 412 in the third scan iteration. If the scan does not meet the criteria for the weakest code the MST 400 moves to the state 410. The state 410 assigns the next code. For example, the next code may be the next weakest code (e.g., X1). Next, the MST 400 moves to the state 414 in the third scan iteration. If the second scan iteration is the last scan iteration, the MST 400 may stop.

In the third scan iteration, the state 412 may scan all memory blocks with the strongest code (e.g., Y2). The scan may be performed on multi-plane blocks and/or single-plane blocks if a bad block has been identified in the multi-plane block. If there is no HLDPC failure, the MST 400 may end the third scan iteration. If there is a single-plane block failure the MST 400 may move to the state 418, which adds the bad block to the bad block list. If there is a multi-plane block HLDPC failure, the MST 400 may move to the state 416. The state 416 may perform a scan with a single-plane configuration with the strongest code (e.g., Y2). If there is a HLDPC failure in the single-plane configuration the MST 400 may move to the state 418, which adds the bad block to the bad block list. If there is no HLDPC failure the MST 400 may end the third scan iterations. If there is a fourth scan iteration, the MST 400 may move to similar state(s) in the fourth scan iteration. If there is not a fourth scan iteration, the MST 400 may end.

In the third scan iteration, the state 414 may scan all memory blocks with the assigned code (e.g., X1). The scan may be performed on multi-plane blocks and/or single-plane blocks if a bad block has been identified in the multi-plane block. The state 414 and the state 412 may run in parallel. The parallel implementation of the states 412 and 414 may be an example of the code rate test embedded in the MST scan 400. If the scan meets the criteria for the assigned code (e.g., no HLDPC failure and the number of iterations to perform is less than a pre-determined threshold) the MST 400 moves to the fourth scan iteration. If the third scan iteration is the last scan iteration then the MST 400 may end. If the scan does not meet the criteria for the assigned code the MST 400 moves to the state 420. The state 420 assigns the next code, and ends the third scan iteration. For example, the next code may be the next weakest code (e.g., Y0). If there is a fourth scan iteration the MST 400 may move to a state in the fourth scan iteration. If there is not a fourth scan iteration, the MST 400 may end.

The MST flow 400 may minimize the test time by implementing multi-plane scans yet still be capable of detecting single-plane bad blocks. The MST 400 may have a thorough code rate test that attempts every block through necessary code rates rather than "predicting" the code rate for each block. The MST 400 may have the code rate test embedded into the pre-conditioning scans with a minimal increase in test time. Embedding the code rate test into the pre-conditioning scans may allow the test time of the MST 400 to be consistent across multiple drives (e.g., when the MST 400 is run automatically on a large number of SSD drives during mass production).

A bad block may be considered a memory block that is not considered usable to store data and/or that should be retired. For example, a bad block may be a defective memory block and/or a memory block that has failed. In one example, a bad block may be on the verge of failure and proactively marked bad. For example, a memory block may be considered bad when the memory block does not meet a certain performance and/or reliability threshold. The SSD controller 70 may test the memory blocks 84a-84n to determine if each of the memory blocks 84a-84n meets such a performance and/or reliability threshold. In one example, bad block detection may be conservative (e.g., the memory block may be retired long before failure). In another example, bad block detection may be aggressive (e.g., the memory block operating very close to specifications may continue to be used in an effort to maximize usable space on the drive 90). The particular criteria to determine whether a block should be marked as bad may be varied to meet the design criteria of a particular implementation. If a memory block is marked bad before failure, the data on the marked memory block may be moved to another location to prevent data loss. The SSD controller 70 may ignore (e.g., not use) the blocks marked bad when processing I/O requests. Ignoring bad blocks may improve the performance and/or reliability of the memory circuit 80.

The functions performed by the diagrams of FIGS. 3-8 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a memory configured to store data; and
   a controller configured to
      process a plurality of input/output requests to a plurality of blocks of the memory that are not marked as bad on a block list,
      perform a code rate test on all of the plurality of blocks of the memory, wherein the code rate test programs each of the plurality of blocks at each of three or more code rates of an error correction code scheme, and decodes each of the plurality of blocks using an iterative decode, and
      mark any of the plurality of blocks identified as bad during the code rate test on the block list, wherein a failure criteria of the code rate test for each of the plurality of blocks includes a number of decoding iterations performed on the respective blocks.

2. The apparatus according to claim 1, wherein the code rate test is performed as part of a manufacturer self-test prior to processing the input/output requests.

3. The apparatus according to claim 1, wherein
   the three or more code rates of the code rate test are arranged in a plurality of tiers in an adaptive code rate technique used by the controller to process the plurality of input/output requests, and
   at least one of the plurality of tiers includes at least two of the code rates.

4. The apparatus according to claim 1, wherein the code rate test initializes a code rate table used by the controller to process the plurality of input/output requests.

5. The apparatus according to claim 1, wherein the code rate test is configured to stop at an intermediate code rate of the three or more code rates based on the number of decoding iterations performed on the plurality of blocks.

6. The apparatus according to claim 1, wherein the code rate test includes a low-density parity-check code to program the plurality of blocks.

7. The apparatus according to claim 1, wherein the failure criteria of the code rate test for each of the plurality of blocks further includes a hard-decision low-density parity-check failure.

8. The apparatus according to claim 1, wherein the failure criteria of the code rate test for each of the plurality of blocks further includes an average number of decoding iterations performed on the respective blocks during the code rate test.

9. The apparatus according to claim 1, wherein the memory and the controller form part of a solid-state drive.

10. A method for scanning a drive memory, comprising the steps of:
    processing a plurality of input/output requests to a plurality of blocks of a memory that are not marked as bad on a block list;
    performing a code rate test on all of the plurality of blocks of the memory, wherein the code rate test programs each of the plurality of blocks at each of three or more code rates of an error correction code scheme, and decodes each of the plurality of blocks using an iterative decode with a controller; and
    marking any of the plurality of blocks identified as bad during the code rate test on the block list, wherein a failure criteria of the code rate test for each of the plurality of blocks includes a number of decoding iterations performed on the respective blocks.

11. The method according to claim 10, wherein the code rate test is performed as part of a manufacturer self-test prior to processing the input/output requests.

12. The method according to claim 10, wherein the three or more code rates of the code rate test are arranged in a plurality of tiers in an adaptive code rate technique used by the controller to process the plurality of input/output requests, and at least one of the plurality of tiers includes at least two of the code rates.

13. The method according to claim 10, further comprising the step of:
    initializing a code rate table used by the controller to process the plurality of input/output requests based on the code rate test.

14. The method according to claim 10, further comprising the step of:
    stopping the code rate test at an intermediate code rate of the three or more code rates based on the number of decoding iterations performed on the plurality of blocks.

15. The method according to claim 10, wherein the code rate test includes a low-density parity-check code to program the plurality of blocks.

16. The method according to claim 10, wherein the failure criteria of the code rate test for each of the plurality of blocks further includes a hard-decision low-density parity-check failure.

17. The method according to claim 10, wherein the failure criteria of the code rate test for each of the plurality of blocks further includes an average number of decoding iterations performed on the respective blocks during the code rate test.

18. The method according to claim 10, wherein the steps are performed in a solid-state drive.

19. An apparatus comprising:
    an interface configured to process a plurality of read/write operations to/from a memory; and
    a control circuit configured to
        process a plurality of input/output requests to a plurality of blocks of the memory that are not marked as bad on a block list,
        perform a code rate test on all of the plurality of blocks of the memory, wherein the code rate test programs each of the plurality of blocks at each of three or more code rates of an error correction code scheme, and decodes each of the plurality of blocks using an iterative decode, and
        mark any of the plurality of blocks identified as bad during the code rate test on the block list, wherein a failure criteria of the code rate test for each of the plurality of blocks includes a number of decoding iterations performed on the respective blocks.

20. The apparatus according to claim 19, wherein the interface and the controller form part of a solid-state drive.

* * * * *